United States Patent
Schaefer et al.

[11] Patent Number: 6,075,290
[45] Date of Patent: Jun. 13, 2000

[54] SURFACE MOUNT DIE: WAFER LEVEL CHIP-SCALE PACKAGE AND PROCESS FOR MAKING THE SAME

[75] Inventors: William Jeffrey Schaefer, San Jose; Pai-Hsiang Kao, Saratoga; Nikhil Vishwanath Kelkar, Santa Clara, all of Calif.

[73] Assignee: National Semiconductor Corporation, Santa Clara, Calif.

[21] Appl. No.: 09/031,167

[22] Filed: Feb. 26, 1998

[51] Int. Cl.$^7$ .................................................. H01L 23/48
[52] U.S. Cl. ........................... 257/737; 257/738; 257/778
[58] Field of Search ................................... 257/737, 738, 257/778, 787

[56] References Cited

U.S. PATENT DOCUMENTS 5,834,844  11/1998  Akagawa et al. ........................ 257/738

OTHER PUBLICATIONS

C4 Product Design Manual, Chapter 1—Technology Overview, Issue: A, pp. 1–5 through 1–8.

Primary Examiner—Carl Whitehead, Jr.
Assistant Examiner—Roy Potter
Attorney, Agent, or Firm—Beyer & Weaver, LLP

[57] ABSTRACT

Disclosed is an IC package. The IC package includes a die having a plurality of conductive pads. A passivation layer is formed over the conductive pads such that the passivation layer has a plurality of passivation vias. Each passivation via is positioned over an associated one of the conductive pads. A resilient protective layer is formed over the passivation layer. The resilient protective layer has a plurality of resilient vias, wherein each resilient via is associated with an associated passivation via. A plurality of under bump pads are in electrical contact with the conductive pads, and each under bump pad is associated with one of the resilient vias. A plurality of contact bumps are formed over the plurality of under bump pads such that each one of the contact bumps is electrically coupled with a selected one of the under bump pads and such that each contact bump is electrically coupled with a selected one of the conductive pads. The resilient protective layer is arranged to absorb stresses introduced at the contact bumps when the IC package is attached to an external substrate; the contact bumps are formed from a material that facilitates absorption of stresses by the resilient protective layer, and the resilient protective layer is further arranged to protect the die. In one preferred embodiment, each under bump pad includes a lip that extends over a portion of the resilient layer. In another preferred embodiment, the contact bumps are formed from a eutectic tin-lead alloy. In another embodiment, a circuit board is disclosed. The circuit board includes a substrate having a plurality of board contacts and the IC package as recited above. In this embodiment, the IC package is attached to the substrate such that each of the contact bumps is coupled with an associated one of the board contacts. In a preferred embodiment, the resilient protective layer of the IC package absorbs stresses introduced at the contact bumps such that an underfill layer is not required between the IC package and the substrate.

18 Claims, 3 Drawing Sheets

SURFACE MOUNT DIE: WAFER LEVEL CHIP-SCALE PACKAGE AND PROCESS FOR MAKING THE SAME

CROSS REFERENCE TO RELATED APPLICATIONS

This application is related to commonly assigned U.S. patent application Ser. No. 09/006,759 filed Jan. 14, 1998 entitled, "A Semiconductor Wafer Having a Bottom Surface Protective Coating" by Kao, et al., which is incorporated herein by reference.

BACKGROUND OF THE INVENTION

The present invention relates generally to integrated circuit (IC) packages with bump type contacts. More particularly, the invention relates to miniature chip scale packages manufactured in wafer form and improved package interconnect structures for absorbing stresses introduced to the bumps after the package is attached to an external substrate, for example.

Currently, in order to remain competitive in the IC industry, IC process engineers continuously strive to reduce the overall size and corresponding cost of IC devices. As a result of this trend toward smaller overall sizes, sizes of individual features of the IC device and package have decreased and circuit density has correspondingly increased. That is, many IC engineers pursue ways to significantly increase the feature density so as to take full advantage of significant decreases in feature size and thereby reduce the overall size of the IC package. Additionally, so as to take full advantage of these significant increases in feature density, IC engineers seek to increase the I/O pin density of IC packages. With these goals in mind, IC chip engineers have developed a wide variety of package designs to maximize I/O pin density and reduce overall package size.

One example of a package design that has a relatively high I/O density is the flip chip type package. The typical flip chip package includes an array of pads to provide interconnections between the IC devices within the die and other electrical components or IC devices external to the die. An array configuration allows the engineer to utilize the package area for I/O pad placement, as opposed to other package designs, such as surface mount packages, which typically provide I/O pins only around the package periphery.

Another example of a package design with a relatively high I/O density is the chip scale package (CSP). The typical CSP has overall package dimensions substantially equal to that of the silicon active device or die that is enclosed within the package. One such type of CSP is manufactured in wafer form and hence referred to as a wafer level CSP or WLCSP. A surface mount die is a WLCSP in which I/O contacts are in bump form and located on the active side of the die.

FIG. 1A is a diagrammatic side view of a conventional flip chip package 100. The flip chip 100 includes a die 102 that typically has a plurality of conventionally fabricated IC device structures (not shown). These IC device structures may include, for example, transistors and interconnect layers. The die 102 has a top surface 108 that includes under bump pads (not shown). Contact bumps 106 are formed on the under bump pads of the top most surface 108. This top surface 108 is opposite a bottom surface 104 of the die 102. The bottom surface 104 is conventionally left bare, or exposed. That is, the bottom surface 104 is typically bare silicon.

A plurality of flip chip packages 101 are typically formed on the surface of a wafer (not shown). After the plurality of flip chip packages are formed on the wafer, each flip chip package is separated from the wafer in a dicing or singulation procedure.

After each flip chip is singulated from the wafer, a flip chip package (e.g., 100) may be inverted and carefully placed onto a portion of an substrate. Each contact bump (e.g., 106) of the flip chip package (e.g., 100) is then electrically coupled to an associated board contact (not shown) of the substrate. As shown, after the contact bump 106 is electrically coupled to the board contact of the substrate, an underfill layer is injected between the substrate and flip chip package 100 and around the contact bump 106 of the flip chip package 100. This underfill layer is required to reduce stresses that are introduced to the contact bump 106 and to improve reliability of the flip chip package 100.

FIG. 1B is a diagrammatic side view of a conductive pad and contact bump region of a conventional flip chip package 101 that is attached to a PCB. FIG. 1B, of course, represents only a portion of the entire flip chip package 101, which package includes a plurality of conductive pads, associated under bump pads, and associated contact bumps. As shown, the flip chip package portion 101 typically includes a die 102, a conductive pad 110, a passivation layer 112, an under bump pad 114, and a contact bump 106. The conductive pad 110 is patterned over the die 102, and the passivation layer 112 is formed over portions of the conductive pad 110 and die 102. The under bump pad 114 is formed over portions of the passivation layer 112 and conductive pad 110. The contact bump 106 is then grown onto the under bump pad 114.

Although conventional flip chip packages provide a means for achieving high density of I/O pads within a small package area, conventional flip chip packages have a few disadvantages. For example, stresses introduced on the contact bump may damage the flip chip package. When the flip chip package's contact bumps are coupled with the PCB's pads, the die of the flip chip package typically has a substantially different coefficient of thermal expansion (CTE) than the PCB. This difference in CTE's causes the die and the PCB to expand and contract at different rates and to pull and push on the contact bumps package and results in deformation and stresses of the contact bumps. These stresses may ultimately result in damage to the flip chip package, such as solder joint fatigue. By way of another stress related problem, stresses introduced at the contact bump may cause the contact bump to push into the underlying layers that form the die and cause substantial craters within the die itself. Another problem that may occur as a result of stresses on the contact bump is that the contact bump may tear open.

To reduce the likelihood of such stress-related problems, an underfill is often required to minimize the CIE mismatch from the die 102 to the substrate 116 and, thus, to improve reliability of the package. Unfortunately, the formation of this underfill layer (e.g., 115) results in an extra process step and an expenditure of man-hours and associated costs for the conventional flip chip package.

Another disadvantage of conventional flip chip packages is chipping during the dicing operation. Chipping is a problem for flip chip packages since the typically exposed bottom surface often fails to provide sufficient mechanical protection under certain stress conditions introduced during singulation. The exposed bottom surface also fails to provide protection from electrostatic shock or light induced bias for flip chip applications. That is, the packages may have functional problems due to photogenerated carriers when the bottom surface (e.g., 104) of the die (e.g., 102) is exposed to light, or the packages may be subject to an undesirable electrostatic shock during handling of the package subsequent to the dicing operation.

The aforementioned problems all contribute to an increase in production cost or a decrease in production yield. Consequently, there is a need for an improved IC package that provides a solution to the aforementioned problems and provides a plurality of contact bumps. Additionally, there is a need for a method for making such an improved package.

SUMMARY OF THE INVENTION

To achieve the foregoing and other objects and according to the purpose of the present invention, an IC package is disclosed. The IC package includes a die having a plurality of conductive pads. A passivation layer is formed over the conductive pads such that the passivation layer has a plurality of passivation vias. Each passivation via is positioned over an associated one of the conductive pads. A resilient protective layer is formed over the passivation layer. The resilient protective layer has a plurality of resilient vias, wherein each resilient via is associated with an associated passivation via. A plurality of under bump pads are in electrical contact with the conductive pads, and each under bump pad is associated with one of the resilient vias. A plurality of contact bumps are formed over the plurality of under bump pads such that each one of the contact bumps is electrically coupled with a selected one of the under bump pads and such that each contact bump is electrically coupled with a selected one of the conductive pads. The resilient protective layer is arranged to absorb stresses introduced at the contact bumps when the IC package is attached to an external substrate; the contact bumps are formed from a material that facilitates absorption of stresses by the resilient protective layer, and the resilient protective layer is further arranged to protect the die. In one preferred embodiment, each under bump pad includes a lip that extends over a portion of the resilient layer. In another preferred embodiment, the contact bumps are formed from a eutectic tin-lead alloy.

In another embodiment, a circuit board is disclosed. The circuit board includes a substrate having a plurality of board contacts and the IC package as recited in the previous paragraph. In this embodiment, the IC package is attached to the substrate such that each of the contact bumps is coupled with an associated one of the board contacts. In a preferred embodiment, the resilient protective layer of the IC package absorbs stresses introduced at the contact bumps such that an underfill layer is not required between the IC package and the substrate.

In another aspect of the invention, a method of fabricating a semiconductor wafer is disclosed. A plurality of dies are provided with each die having a top surface with a plurality of conductive pads, a bottom surface that is opposite the top surface, and a plurality of scribe lines along the periphery of each die. A passivation layer is provided over the conductive pads such that the passivation layer has a plurality of vias with each via being positioned over an associated one of the conductive pads. A resilient protective layer is formed over the passivation layer. A plurality of under bump pads are formed over the passivation layer such that each under bump pad is electrically coupled with an associated one of the conductive pads through an associated one of the vias. Finally, a plurality of contact bumps are formed over the plurality of under bump pads such that each one of the contact bumps is electrically coupled with a selected one of under bump pads and such that each contact bump is electrically coupled with a selected one of the conductive pads. The resilient protective layer is formed to absorb stresses introduced at the contact bumps. The contact bumps are formed from a material that facilitates absorption of stresses by the resilient protective layer.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Methods and apparatus for a wafer level chip scale package (CSP) having contact bumps are described below. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

In general, the present invention relates to IC packages that include bump type contacts. Each contact bump is formed over an under bump pad supported by a resilient protective layer. The resilient protective layer acts as a cushion between the underlying layers and the contact bumps of the IC package when the IC package is mounted onto an external substrate. The contact bumps are formed from a material that facilitates the cushioning effect of the resilient protective layer, such as a eutectic solder material. Although the present invention is described as being implemented in surface mount type wafer level CSPs, of course, it should be well understood to those skilled in the art that the present invention is not limited to wafer level CSPs. That is, the present invention may be implemented on any IC package that has contact bumps in which stresses are introduced, such as a flip chip package or any other surface mount packages.

One difference between a conventional flip chip package and a surface mount die is that an underfill material is not required in the case of the surface mount die. Another significant advantage of surface mount dies is ease of assembly. Surface mount dies are fully compatible with conventional surface mount assembly processes as opposed to a flip chip package which often requires more sophisticated equipment and processes. Further, surface mount dies offer smaller footprints in available surface mount packages. In other words it offers higher interconnect density in surface mount packages.

Figure 1A:
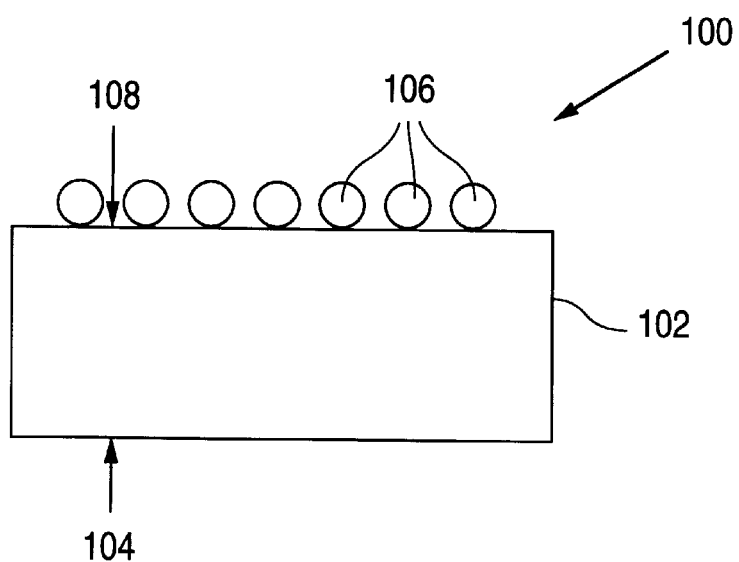
FIG. 1A is a diagrammatic side view of a conventional flip chip type package.
Figure 1B:
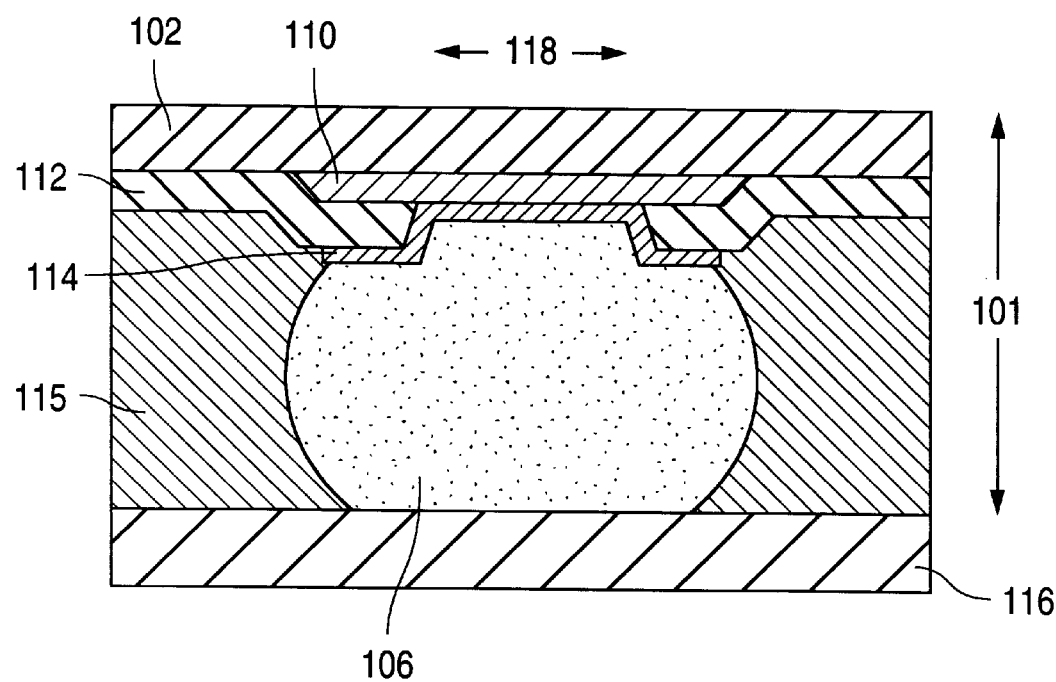
FIG. 1B is a diagrammatic side view of a conductive pad and contact bump region of a conventional flip chip package that is attached to a PCB.
Figure 2:
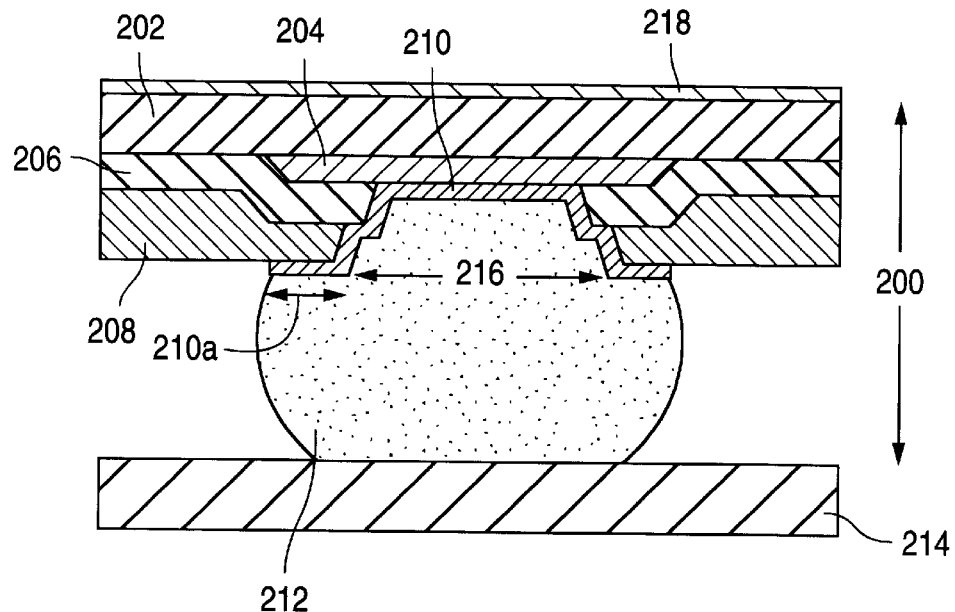
FIG. 2 is a diagrammatic side view of a conductive pad and contact bump region of a surface mount die, a wafer level CSP, that is inverted and mounted onto a portion of an external substrate in accordance with one embodiment of the present invention.

The wafer level CSP of the current invention may take various forms that include a resilient protective layer that is configured to absorb stresses introduced through the contact bump of the wafer level CSP. FIG. 2 is a diagrammatic side view of a conductive pad and contact bump region of a wafer level CSP 200 that is inverted and mounted onto a portion of an external substrate 214 in accordance with one embodiment of the present invention. For simplification purposes, only a portion of the wafer level CSP 200 is shown in FIG. 2. For example, only one contact bump 212 is shown in FIG. 2, although the wafer level CSP will typically include a plurality of contact bumps.

As shown, the wafer level CSP 200 includes a protective coating 218, a die 202, a conductive pad 204, a passivation layer 206, a resilient protective layer 208, an under bump pad 210, and a contact bump 212. The die 202 may include a plurality of integrated circuit structures (not shown), such as MOS transistors (not shown). The conductive pad 204 is formed over the die 202 and may be coupled to at least one of the integrated circuit structures of the package layers 202. The passivation layer 206 is formed over portions of the conductive pads 204. The passivation layer 206 forms a portion of a via 216 that is positioned over the conductive pad 204

The resilient protective layer 208 is formed over portions of the passivation layer 206. Like the passivation layer 206, the resilient protective layer 208 also forms a portion of the via 216 that is positioned over the conductive pad 204 of the die 202. Preferably, the under bump pad 210 is formed within the via 216 and over the conductive pad 204. Of course, the via of the resilient protective layer 208 does not have to be positioned over the via of the passivation layer 206. That is, the via of the resilient protective layer may be offset from the via of the passivation layer 206, wherein the conductive pad 204 is electrically coupled to the under bump pad by a conductive layer, such as a redistribution layer.

The contact bump 212 is formed over the under bump pad 210, and is electrically coupled with the under bump pad 210 and, thus, with the conductive pad 204. Additionally, the contact bump 212 may be coupled with any integrated circuit structures of the die 202 that are coupled with the conductive pad 204. As shown, the protective coating 218 may be formed over a bottom surface of the die 202.

The protective coating 218 is configured to reduce chipping during wafer level CSP singulation. Several embodiments of the protective coating 218 are further described in commonly assigned U.S. patent application Ser. No. 09/006, 759 filed Jan. 14, 1998 entitled, "A Semiconductor Wafer Having a Bottom Surface Protective Coating" by Kao, et al., which is incorporated herein by reference.

The conductive pad 204 may be formed from any suitably conductive material, such as metal. For example, aluminum, copper, or various alloys may be selected. The passivation layer 206 may be formed from any suitable insulation type material, such as silicon dioxide ($SiO_2$). For special cases, when the via of the resilient protective layer 208 is not over the via of the passivation layer 206, the conductive pad 204 may be linked to the under bump pad 210 with a conductive layer.

The resilient protective layer 208 may be formed from any material that is suitable for absorbing stresses that are introduced at the contact bump 212. That is, the resilient protective layer 208 acts as a shock absorber or cushion for the contact bumps as pressure is exerted on the contact bumps. Preferably, the resilient protective layer 208 has a modulus of elasticity that is less than about 3.0 GPa. Preferably, the resilient protective layer 208 is formed from a material that can withstand high temperatures so that high temperature solder material may be used for attaching the package to an external substrate. For example, a polyimide or benzocyclobutene (BCB) material meets the above requirements, and, thus, works well as a resilient protective layer.

The resilient protective layer 208 may have any thickness that is suitable for absorbing stresses introduced at the contact bump 212. That is, the resilient protective layer 208 should be thick enough to provide a large enough cushion for the stresses introduced at the contact bump 212 so that the stresses do not damage the wafer level CSP 200. Preferably, the resilient protective layer has a thickness that is greater than about 4 $\mu$m. Additionally, the resilient protective layer 208 should have a thickness that is not prohibitively expensive to fabricate. Most preferably, the thickness is between about 4 and about 10 $\mu$m.

The under bump pad 210 may be formed from any suitably conductive and solder wettable material. For example, aluminum with NiV works well. Preferably, the under bump pad 210 also includes a lip 210a that extends over a portion of the passivation layer 206. The lip 210a may enhance the shock absorption capabilities of the resilient protective layer 208 by providing a large surface area between the resilient protective layer 208 and the bump 212. This large surface area may allow the absorption of more stresses from the bump than a resilient protective layer without a lip. Preferably, the under bump pad 210 is in the form of a plurality of steps with one step formed over the edge of the resilient protective layer 208 and a second step formed over the edge of the passivation layer 206. Besides providing surface area for transmitting the stress from the contact bump 212 to the resilient protective layer 208, the under bump pad 210 also provides a surface upon which the contact bump 212 is formed.

The contact bump 212 is formed using conventional solder bumping or balling techniques. However, it has been found that the composition of the solder material used for the contact bumps has a significant effect on the cushioning provided by the resilient protective layer. Thus, it is preferable that a solder material is chosen such that the cushioning effect of the resilient protective layer is enhanced. For example, when a tin and lead composition is chosen for the contact bumps, it has been discovered that a eutectic composition works well and facilitates the cushioning effect of the resilient protective layer 208. Although a eutectic composition is defined as 63 percent tin and 37 percent lead, other variations of such compositions are expected to work as well. For example, a composition that has at least about 60 percent tin is expected to enhance the cushioning effect of the resilient protective layer. Likewise, a low lead composition is expected to work well, such as a composition that has at most about 40 percent lead. In contrast, when a high lead contact bump is used (e.g., 90 percent lead and 10 percent tin), it has been found that the resilient protective layer will not absorb enough stresses to significantly increase the reliability of the IC package.

The pitch of the contact bumps varies with each application of the package However, the pitch of the contact bumps has a significant impact on ease of application of this package and associated costs, such as assembly costs. Preferably, a pitch is chosen such that existing surface mount assembly techniques and equipment may be utilized in a cost effective manner. For example, a contact bump pitch of about 500 $\mu$M works well with existing surface mount techniques and equipment.

As shown, the wafer level CSP 200 is inverted onto the external substrate 214 The solder in the contact bump 212 is then reflowed so that the contact bump 212 couples to an associated board contact on the external substrate 214. Of course, other contact bumps (not shown) on the package 200 are coupled to the board in a similar manner.

The external substrate 214 may be in any form that is suitable for electrically coupling the wafer level CSP 200 to one or more other electrical components (not shown). For example, the external substrate 214 may be in the form of the a multilayered printed circuit board (PCB). The PCB may include a plurality of other electrical components (including the wafer level CSP 200) that perform a set of functions for a particular application, for example.

A number of conventional techniques are available for attaching electrical components to a PCB. For example, each contact bump 212 of the wafer level CSP 200 may be attached to the PCB 214 using conventional surface mount assembly techniques. The topmost surface of the PCB is configured to provide a plurality of board contacts (not shown) upon which an wafer level CSP may be mounted. That is, each contact bump (e.g., 212) of the package 200 is attached to an associated board contact of the PCB 214 using conventional solder reflow techniques.

Figure 3:
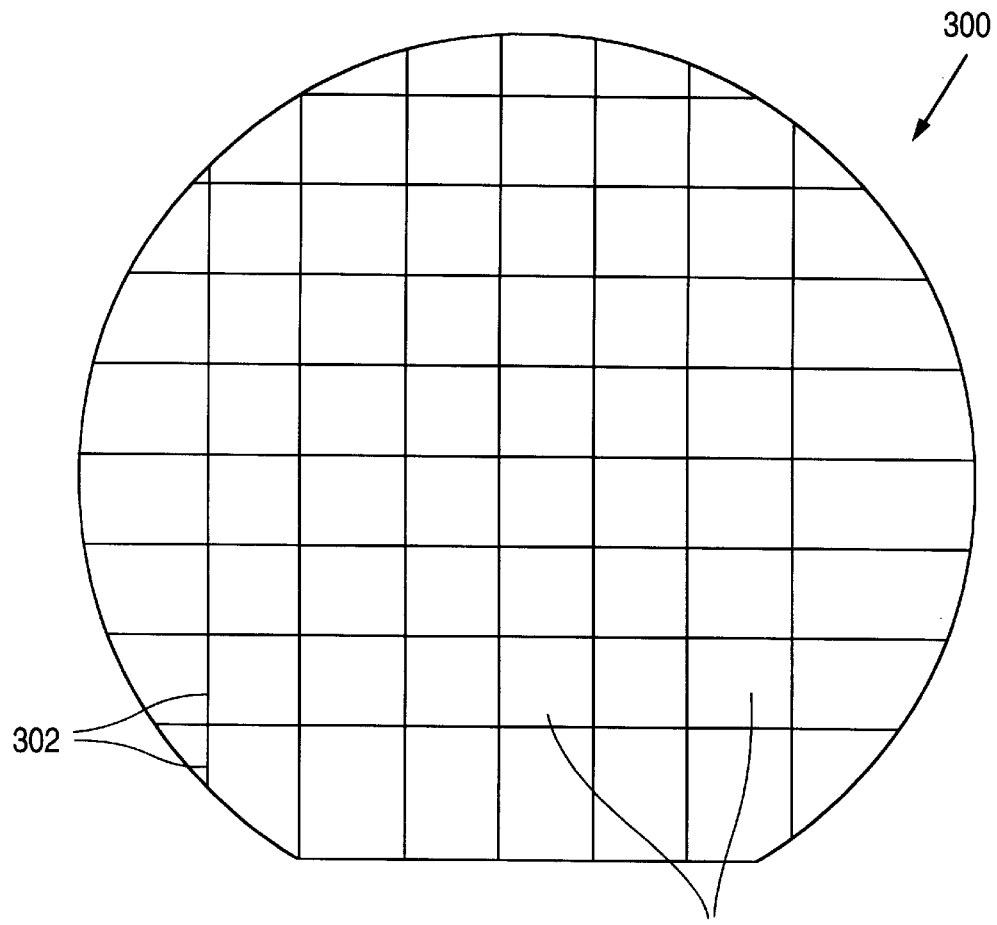
FIG. 3 is a diagrammatic top view of a wafer that includes a plurality of the integrated circuit packages as illustrated in FIG. 2 in accordance with one embodiment of the current invention.

FIG. 3 is a diagrammatic top view of a wafer that includes a plurality of the wafer level CSPs 200 as illustrated in FIG. 2 in accordance with one embodiment of the current invention. As shown, the packages 200 are formed on the wafer 300 in an array pattern. Scribe lines 302 are positioned between each package 200. When the wafer is diced, the dicing tool cuts along the scribe lines 302. Preferably, the resilient protective layer and the passivation layer are not present within the scribe lines 302. The resilient protective layer and the passivation layer may be removed from the scribe lines 302 to prevent the resilient protective layer and passivation layers from peeling off after the wafer is diced or cracking during dicing.

A plurality of contacts bumps are formed on a top surface of each package 200 of the wafer 300. A protective film (shown in FIG. 2 as 216) may be deposited over a bottom surface of the wafer 300. The protective film 216 of the bottom surface aids in reducing chipping during the wafer dicing process. Preferably, the protective film 216 is in the form of a thick film, and is formed by any suitable process for applying a thick film. In one embodiment, a screen printing process is utilized. By way of another example, a spinning type process may be used, wherein a thick film is spread across the bottom surface of the wafer. Several embodiments of method for forming the protective coating 218 are further described in commonly assigned U.S. patent application Ser. No. 09/006,759 filed Jan. 14, 1998 entitled, "A Semiconductor Wafer Having a Bottom Surface Protective Coating" by Kao, et al., which is incorporated herein by reference.

Figure 4:
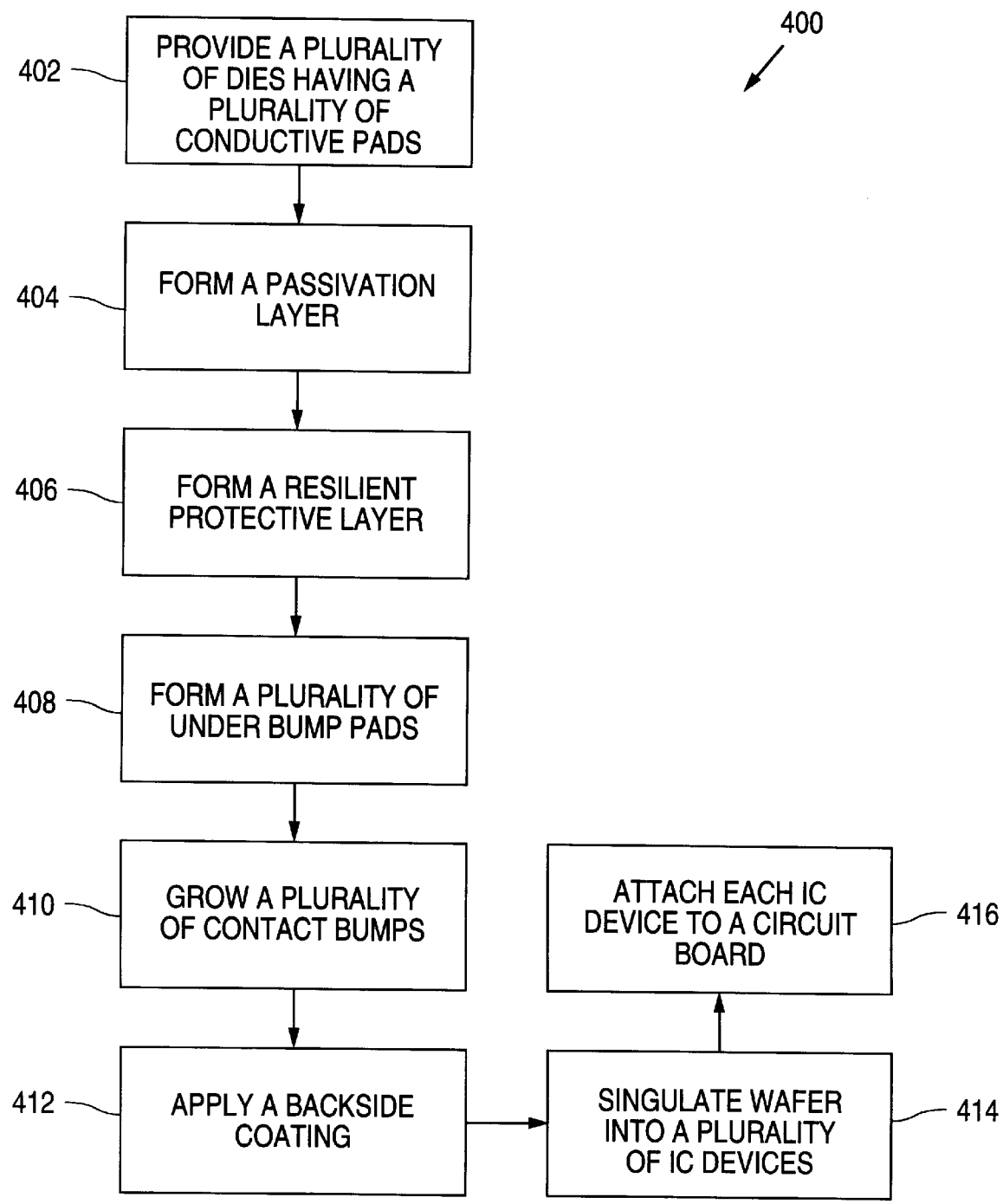
FIG. 4 is a flow chart illustrating a process of fabricating a wafer level CSP that includes a plurality of semiconductor dies having a plurality of under bump pads formed over a resilient protective layer with contact bumps formed thereon in accordance with one embodiment of the present invention.

FIG. 4 is a flow chart illustrating a process 400 of fabricating a wafer level CSP that includes a plurality of semiconductor dies having a plurality of under bump pads formed over a resilient protective layer with contact bumps formed thereon in accordance with one embodiment of the present invention. Initially, a plurality of dies are provided in operation 402. As previously described, each die may include a plurality of integrated circuit structures, such as MOS transistors. Each die also includes a plurality of conductive pads on the top surface of the die. The integrated circuit structures are typically comprised of a plurality of layers. The integrated circuit structures, including the conductive pads, are formed using conventional fabrication techniques.

After the integrated circuit fabrication is completed, in operation 404 a passivation layer is formed over portions of the plurality of conductive pads. The passivation layer is typically formed by doping a silicon layer to form $SiO_2$ layer, for example. Conventional photolithography techniques are then used to pattern a plurality of vias into the $SiO_2$ layer. Each passivation via is positioned over an associated conductive pad.

In operation 406, a resilient protective layer is then formed over the passivation layer. A plurality of vias are then patterned within the resilient protective layer so that each resilient via is positioned over an associated passivation via and conductive pad. As previously discussed, some or all of the resilient vias may be offset from associated passivation vias, wherein the offset resilient via is linked to the associated passivation via through a conductive layer. The resilient protective layer may be formed by applying multiple coatings so as to build a "thick" resilient protective layer. For example, four to six layers works well. Preferably, the resilient protective layer and the passivation layer are removed from the scribe lines of the wafer before singulation is performed.

In operation 408, a plurality of under bump pads are then formed over portions of the passivation layer and conductive pads. Each under bump pad is positioned over an associated resilient via. The resilient protective layer, resilient vias, and under bump pads are formed using conventional fabrication techniques. For example, the under bump pads may be formed by a conventional sputtering technique, which technique typically results in a relatively "thin" layer of under bump pads. By way of example, the under bump pads typically have a thickness of about a few thousand angstroms.

After the under bump pads are formed, a plurality of contact bumps are formed over the under bump pads in operation 410. Each contact bump is formed over an associated under bump pad. The contact bumps are formed using conventional solder attach techniques. Next, a backside coating may be applied to the bottom surface of the wafer in operation 412.

After the wafer level CSPs on the wafer are formed, in operation 414 the wafer is singulated into a plurality of individual wafer level CSPs. In operation 414, each individual wafer level CSP may then be attached to an external substrate, such as a PCB. The wafer level CSP may be attached using any technique that is suitably for the particular wafer level CSP. For example, for a surface mount package, each contact bump of the wafer level CSP is placed over a board contact of the PCB. The solder is then reflowed in the contact bumps so that the contact bumps are electrically coupled with the board contacts of the PCB.

The aforementioned layers are formed using conventional fabrication techniques. For example, The patterned layers are formed using well known photolithography techniques. Patterning is typically accomplished by depositing a photoresist layer over the layer to be patterned, and then selectively exposing the photoresist to light through a patterned reticle. Once exposed, the photoresist is developed to form a photoresist mask that is used in etching layers that are exposed and not covered by the photoresist material.

The present invention has many advantages over conventional integrated circuit packages. For example, the resilient protective layer of the packages absorbs stresses introduced at the contact bumps and thereby enhances the reliability of the packages. That is, the resilient protective layer provides a relatively compliant material between the relatively compliant under bump pad and the relatively rigid underlying die. This resilient protective layer also provides extra protection for the underlying active IC device. Thus, when a package of the present invention is mounted onto a PCB, for example, any stresses introduced through the contact bumps and under bump pad are absorbed by the resilient protective layer. In contrast, a conventional package typically has a relatively rigid passivation layer adjacent to the compliant under bump pad.

As a result of the relatively elasticity of the resilient protective layer, an underfill layer is not necessarily required. Conventionally, an underfill layer must be injected between the package and PCB and around the contact bumps. The underfil layer could then absorb stresses introduced in the contact bumps due to differences in CTE, for example, of the die and PCB. By eliminating the underfill layer, the present invention may result in a significant reduction of costs that are associated with the injection of an underfill layer. Of course, an underfill layer may be used, along with the resilient protective layer, for additional protection against stress.

When a protective coating is used on the bottom surface of each wafer level CSP, the package requires no encapsulation, as compared with many conventional surface mount packages resulting in significant assembly cost reduction. Thus, the present invention may provide a substantial reduction in the overall size of the wafer level CSP, as compared with conventionally encapsulated packages.

Additionally, low cost surface mount assembly equipment may be utilized when a relatively low contact bump pitch is chosen. For example, when the contact bump pitch is about 500 μm, standard surface mount assembly equipment may be used. In contrast, conventional flip chip packages, which typically have a pitch that is relatively higher than a surface mount package, require relatively expensive assembly equipment.

Although the foregoing invention has been described in some detail for purposes of clarity of understanding, it will be apparent that certain changes and modifications may be practiced within the scope of the appended claims. For example, contact bumps may be disposed on the electrical contacts of each die subsequent to, rather than prior to, the operation of applying the thick film. Accordingly, the present embodiments are to be considered as illustrative and not restrictive, and the invention is not to be limited to the details given herein, but may be modified within the scope and equivalents of the appended claims.

We claim:

1. An integrated circuit (IC) package comprising:
   a die having a plurality of conductive pads;
   a passivation layer formed over the conductive pads such that the passivation layer has a plurality of passivation vias, each passivation via being positioned over an associated one of the conductive pads;
   a resilient protective layer formed over the passivation layer, the resilient protective layer having a plurality of resilient vias, each resilient via being associated with an associated passivation via;
   a plurality of under bump pads that are in electrical contact with the conductive pads, each under bump pad being associated with one of the resilient vias; and
   a plurality of contact bumps formed over the plurality of under bump pads such that each one of the contact bumps is electrically coupled with a selected one of the under bump pads and such that each contact bump is electrically coupled with a selected one of the conductive pads,
   wherein the resilient protective layer is formed from a material that absorbs stresses introduced at the contact bumps when the integrated circuit package is attached to an external substrate such that an underfill layer is not required between the IC package and the substrate.

2. The IC package recited in claim 1 wherein each under bump pad includes a lip portion that extends over a portion of the resilient protective layer.

3. The IC package recited in claim 1 wherein the resilient protective layer has a modulus of elasticity of less than about 3.0 GPa.

4. The IC package recited in claim 1, wherein the die includes a top surface that is opposite a bottom surface, the IC package further comprising:
   a protective coating over the bottom surface of the die for reducing chipping when the IC package is singulated from a wafer.

5. A circuit board comprising:
   a substrate having a plurality of board contacts;
   the IC package as recited in claim 1 attached to the substrate such that each of the contact bumps is coupled with an associated one of the board contacts.

6. The circuit board as recited in claim 5, wherein the resilient protective layer of the IC package absorbs stresses introduced at the contact bumps such that an underfill layer is not required between the IC package and the substrate.

7. The IC package recited in claim 5, wherein the IC package is a one selected from the group comprising a surface mount package, a chip scale package, and a flip chip type package.

8. The IC package recited in claim 1, wherein the contact bumps are formed from a eutectic tin-lead alloy.

9. The IC package recited in claim 8, wherein the eutectic tin-lead alloy has a composition of about 63 percent tin and about 37 percent lead.

10. The IC package recited in claim 1, wherein the eutectic tin-lead alloy has a composition of at most 40 percent lead.

11. The IC package recited in claim 1, wherein the eutectic tin-lead alloy has a composition of at least 60 percent tin.

12. The IC package recited in claim 1, wherein each under bump pad forms a plurality of steps over portions of the passivation layer and the resilient protective layer.

13. The integrated circuit package recited in claim 1, wherein the IC package has a size that is substantially equal to that of the die.

14. The integrated circuit package recited in claim 1, wherein the contact bumps have a pitch of about 500 μm.

15. The IC package recited in claim 1, wherein the vias of the resilient protective layer are formed so as to avoid contact between the resilient protective layer and the conductive pads.

16. An integrated circuit (IC) package comprising:
   a die having a plurality of conductive pads;
   a passivation layer formed over the conductive pads such that the passivation layer has a plurality of passivation vias, each passivation via being positioned over a associated one of the conductive pads;

a resilient protective layer formed over the passivation layer, the resilient protective layer having a plurality of resilient vias, each resilient via being associated with an associated passivation via;

a plurality of under bump pads that are in electrical contact with the conductive pads, each under bump pad being associated with one of the resilient vias; and a plurality of contact bumps formed over the plurality of under bump pads such that each one of the contact bumps is electrically coupled with a selected one of the under bump pads and such that each contact bump is electrically coupled with a selected one of the conductive pads, wherein the resilient protective layer is one of a group consisting of polyimide and benzocyclobutene (BCB) material.

17. The IC package recited in claim 1 wherein the resilient protective layer has a thickness of greater than about 4 $\mu$m.

18. The IC package recited in claim 1 wherein the resilient protective layer has a thickness of between about 4 and about 10 $\mu$m.

* * * * *